United States Patent [19]
Luich

[11] Patent Number: 5,801,424
[45] Date of Patent: Sep. 1, 1998

[54] MOSFET WITH REDUCED LEAKAGE CURRENT

[75] Inventor: Thomas Luich, Puyallup, Wash.

[73] Assignee: National Semiconductor Corporation, Santa Clara, Calif.

[21] Appl. No.: 690,596

[22] Filed: Jul. 31, 1996

Related U.S. Application Data

[63] Continuation of Ser. No. 389,720, Feb. 16, 1995, abandoned.
[51] Int. Cl.$^6$ .................. H01L 29/76; H01L 29/94; H01L 31/062
[52] U.S. Cl. .................. 257/377; 257/382; 257/384
[58] Field of Search .................. 257/377, 382, 257/383, 384, 768, 769, 770, 370, 369

[56] References Cited

U.S. PATENT DOCUMENTS

| | | | |
|---|---|---|---|
| 4,714,685 | 12/1987 | Schubert | 437/41 |
| 4,734,382 | 3/1988 | Krishna | 437/31 |
| 5,107,321 | 4/1992 | Liderem et al. | 357/43 |
| 5,124,775 | 6/1992 | Iranmanesh | 257/370 |
| 5,219,784 | 6/1993 | Solheim | 437/57 |
| 5,234,847 | 8/1993 | Iranmanesh | 437/34 |
| 5,314,832 | 5/1994 | Deleonibus | 437/27 |
| 5,338,694 | 8/1994 | Liderem et al. | 437/31 |
| 5,384,485 | 1/1995 | Nishida et al. | 257/751 |

FOREIGN PATENT DOCUMENTS

| | | | |
|---|---|---|---|
| 0 420 748 A1 | 4/1991 | European Pat. Off. | H01L 21/336 |
| 0 422 824 A1 | 4/1991 | European Pat. Off. | H01L 21/336 |
| 0420748 | 4/1991 | European Pat. Off. | |
| 0422824 | 4/1991 | European Pat. Off. | |
| 0 480 446 A3 | 4/1992 | European Pat. Off. | H01L 21/336 |
| 0480446 | 4/1992 | European Pat. Off. | |

OTHER PUBLICATIONS

Chi Chang, et al., "Corner–Field Induced Drain Leakage in Thin Oxide MOSFETs," IEEE 1987, pp. 714–717.

T.Y. Chan, et al., "The Impact of Gate–Induced Drain Leakage Current on MOSFET Scaling," IEEE 1987, pp. 718–721.

*Primary Examiner*—Wael Fahmy
*Attorney, Agent, or Firm*—Limbach & Limbach L.L.P.

[57] ABSTRACT

A metal-oxide-semiconductor field effect transistor (MOSFET) with reduced leakage current includes drain and source regions separated by a channel, a drain terminal over a portion of the drain region, a source terminal over a portion of the source region and a gate terminal opposite the channel. An oxide layer is deposited over the remaining portions of the drain and source regions, as well as on the adjacent vertical sides and top edges of the drain, source and gate terminals. A silicide layer is deposited over the gate terminal between the oxide-covered top edges thereof and over the drain and source terminal up to the oxide-covered top edges thereof. With oxide over the drain source regions instead of silicide, parasitic Schottky diodes are avoided, thereby eliminating leakage current due to such parasitic elements. Additionally, the oxide layer over the drain and source regions blocks pldd and nldd diffusions, thereby preventing impingement of the drain and source regions under the gate and adjacent oxide spacers and thereby significantly reducing leakage current due to band-to-band tunneling.

13 Claims, 9 Drawing Sheets

MOSFET WITH REDUCED LEAKAGE CURRENT

This is a continuation of application Ser. No. 08/389,720 filed on Feb. 16, 1995 now abandoned.

BACKGROUND OF THE INVENTION

1. Field of the Invention

The present invention relates to integrated circuits with metal oxide semiconductor field effect transistors (MOSFETs), and in particular, to MOSFETs with reduced leakage current.

2. Description of the Related Art

Integrated circuits (ICs) containing digital, short channel, silicided complementary metal oxide semiconductor (CMOS) and combination bipolar and CMOS (BiCMOS) transistors are seeing increasing use in linear applications. However, whereas digital applications tend to be forgiving with respect to slight variations in voltage levels and charge accumulation or leakage, many linear applications have much more stringent requirements.

One linear application in particular which has stringent device requirements is a charge pump for phase lock loop (PLL) circuits. A charge pump requires extremely low leakage since the frequency of the voltage controlled oscillator (VCO) that it drives will vary as leakage causes charging or discharging of the control capacitor between the charge pump and the VCO input. Leakage problems are exacerbated by the fact that the charge pump output components driving the VCO are typically large because of drive, output resistance, operating range and margin requirements. It is becoming increasingly common for leakage current limits to be less than one nanoampere, with total output device widths of 6000 microns (3600 microns for PMOS plus 2400 microns for NMOS). (Further discussion of such charge pump circuits can be found in copending, commonly assigned U.S. patent application Ser. No. 08/335,091, filed Nov. 7, 1994, and entitled "Cascode Switched Charge Pump Circuit", the disclosure of which is incorporated herein by reference.)

Figure 1:
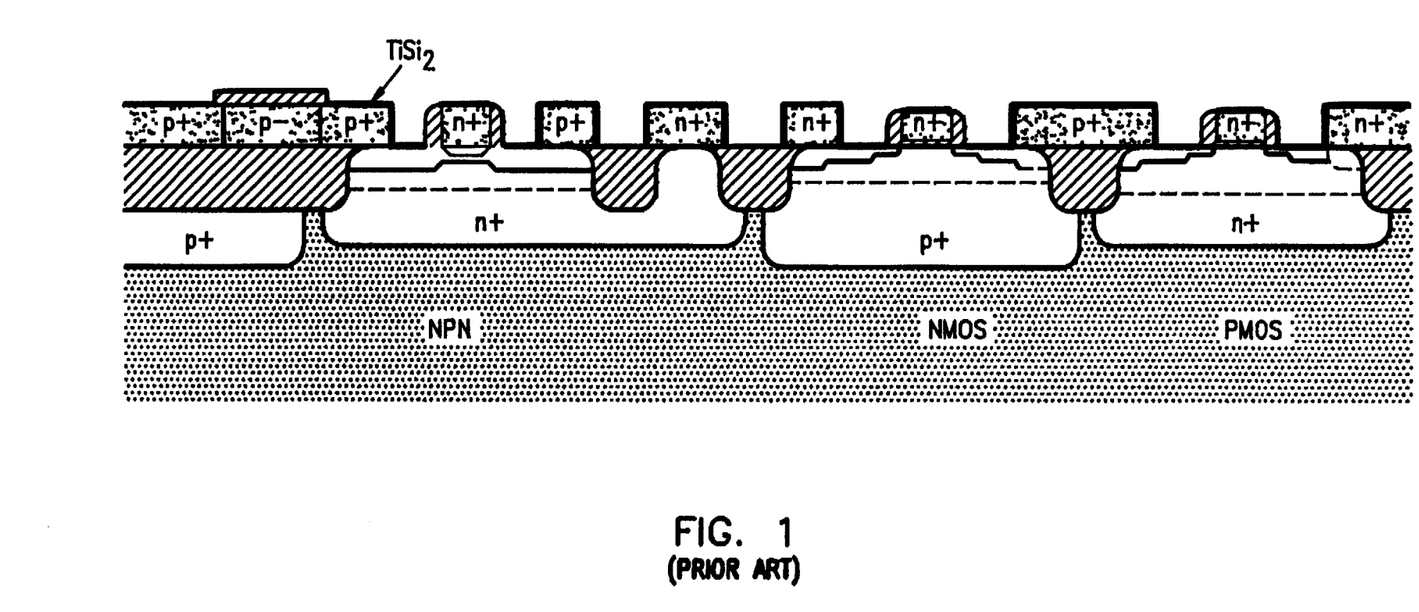
FIG. 1 is a cross sectional view of a portion of a conventional BiCMOS IC.

Referring to FIG. 1, a cross section of a conventional BiCMOS IC using short channel, contactless, silicided devices is shown. This cross sectional view depicts resistors and bipolar, PMOS and NMOS transistors up through the silicidation step in process flow. It can be seen that both the polysilicon and single crystal silicon are silicided. As is well known, the silicide (e.g. titanium silicide, $TiSi_2$) reduces the resistance of the polysilicon gate and single crystal silicon source and drain (e.g. to approximately two ohms per square).

However, whereas the reduced polysilicon and single crystal silicon resistance due to the silicide is generally desirable, such silicidation introduces a problem to which some linear applications are particularly sensitive. Where the silicide overlays the P-type source and drain regions, parasitic Schottky diodes are formed in those areas where the source or drain has been consumed by the silicide. These parasitic Schottky diodes which are formed are of the field plate type, due to field oxide walling, and are known to be high leakage devices. Further, an additional problem, albeit somewhat unrelated to the silicide per se, is drain-to-well leakage due to band-to-band tunneling caused by impingement of the source and drain regions under the gate oxide and oxide spacer edges.

Accordingly, it would be desirable to have a digital, short channel CMOS or BiCMOS IC having the advantages of silicided polysilicon while also having significantly reduced leakage currents compatible with the stringent device requirements of many linear applications.

SUMMARY OF THE INVENTION

In accordance with the present invention, a MOSFET with reduced leakage current can be realized which avoids the creation of parasitic Schottky diodes, thereby eliminating leakage current due to such parasitic elements, and further by blocking p+s/d and n+s/d diffusions into the drain and source regions, thereby preventing impingement of the drain and source regions under the gate and adjacent component spacers and thereby significantly reducing leakage current due to band-to-band tunneling.

A MOSFET with reduced leakage current in accordance with one embodiment of the present invention includes a semiconductor substrate with drain and source regions separated by a channel, a drain terminal over a portion of the drain region, a source terminal over a portion of the source region and a gate terminal opposite the channel. A first silicide layer is on the drain terminal, a first nonsilicide, e.g. oxide, layer covers another portion of the drain region and a second silicide layer is on the gate terminal.

In one preferred embodiment of a MOSFET with reduced leakage current in accordance with the present invention, a second nonsilicide, e.g. oxide, layer covers another portion of the source region. In another preferred embodiment, the silicide layers over the drain and gate terminals are narrower than the drain and gate terminals and do not extend to at least one of the edges thereof. In yet another preferred embodiment, the source terminal has a third silicide layer which is narrower than the source terminal and does not extend to at least one of the edges thereof.

These and other features and advantages of the present invention will be understood upon consideration of the following detailed description of the invention and the accompanying drawings.

DETAILED DESCRIPTION OF THE INVENTION

Figure 2:
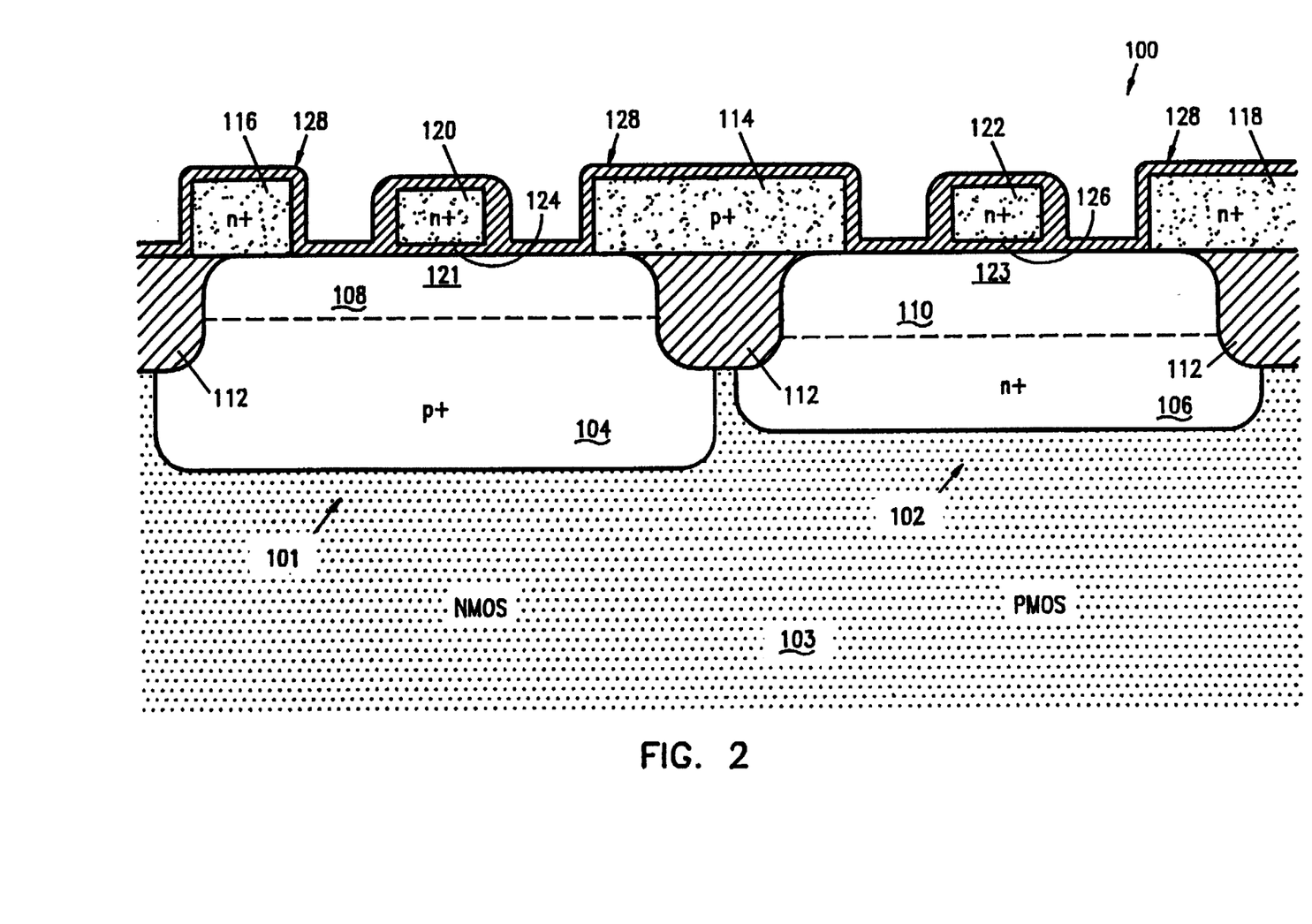
FIG. 2 is a cross sectional view of a portion of a BiCMOS IC with complementary MOSFETs in accordance with one embodiment of the present invention up to the oxidation in the process flow.

Referring to FIG. 2, a cross section of a portion 100 of a BiCMOS IC with complementary MOSFETs 101, 102 in accordance with one embodiment of the present invention is shown at the oxidation step in the process flow. (In a preferred embodiment of the present invention, the process flow is as disclosed in the following U.S. Patents, the disclosures of which are incorporated herein by reference: U.S. Pat. Nos. 4,727,046; 5,079,182; 5,081,518; 5,082,796; 5,107,321; 5,219,784; 5,338,694; and 5,338,696.) The substrate 103 has had the P+104 and N+106 tubs implanted for the NMOS and PMOS devices, respectively. The P-type lightly doped diffusion (pldd) 108 and N-type lightly doped diffusion (nldd) 110 are in place within the P+104 and N+106 tubs, respectively. Surrounding these tubs 104, 106, are oxide spacers 112. Forming the drain terminals is a deposit of P+polysilicon 114. Forming the source terminals are deposits of N+polysilicon 116, 118. Forming the gate terminals are deposits of N+polysilicon 120, 122 separated by gate oxides 124, 126 from the channels 121, 123 within the pldd 108 and nldd 110 regions. Deposited over all of these elements is a layer of oxide 128 (e.g. silicon dioxide, $SiO_2$).

Figure 3:
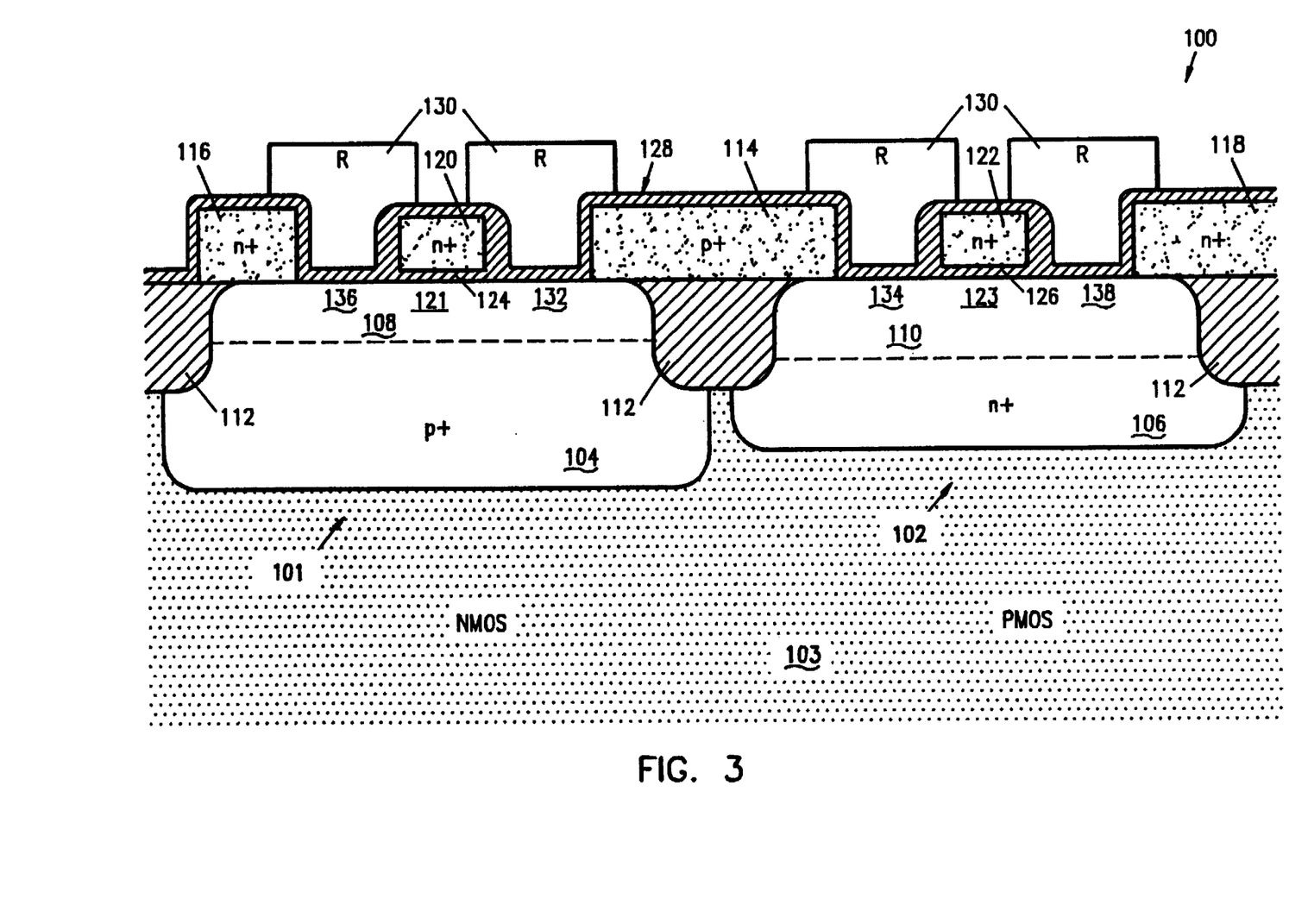
FIG. 3 illustrates the IC of FIG. 2 following the depositing of resist material.

Referring to FIG. 3, the next step is to deposit resist material 130 over the drain regions 132, 134 and source regions 136, 138 of the NMOS 101 and PMOS 102 devices.

Figure 4:
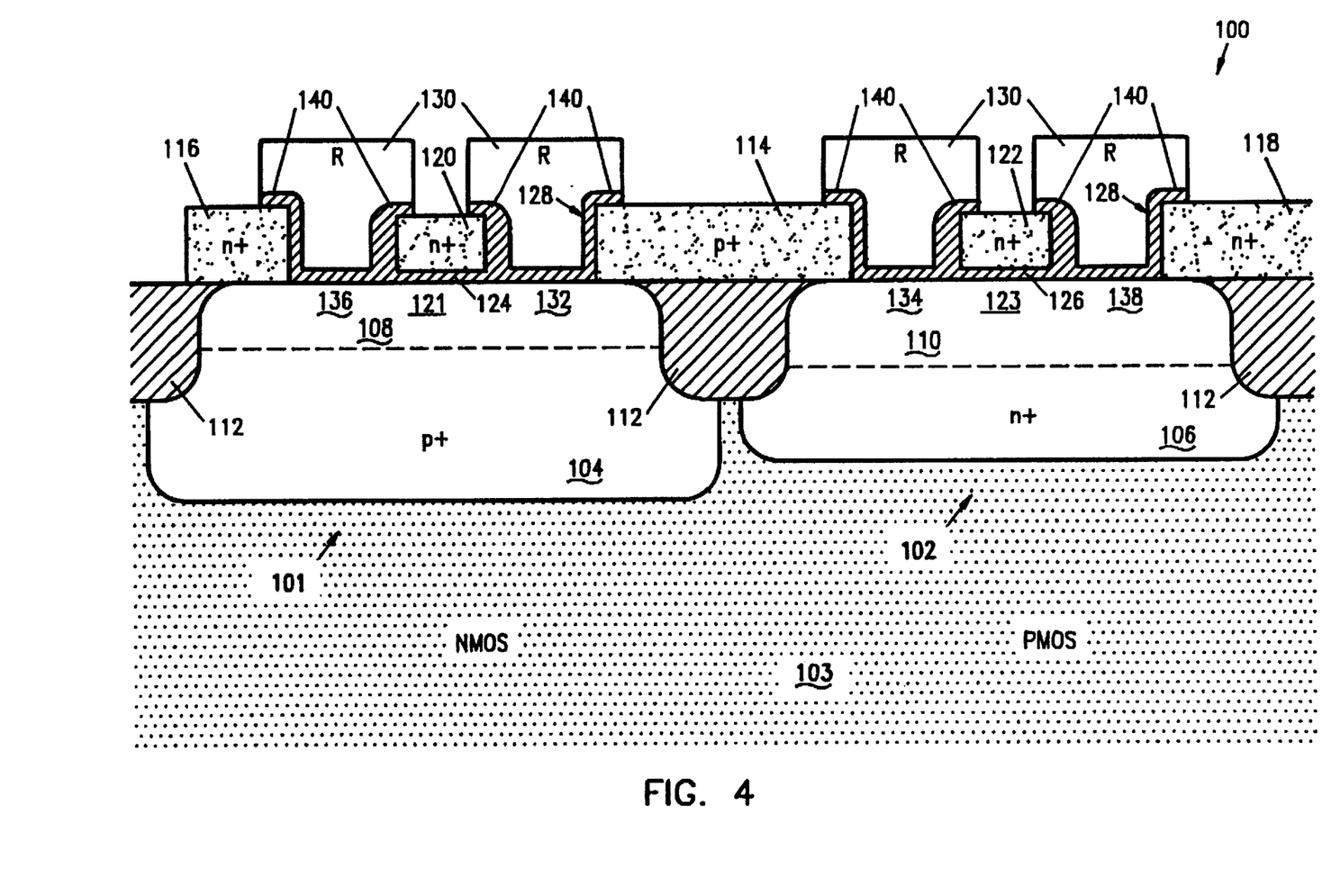
FIG. 4 illustrates the IC of FIG. 3 following the removal of exposed oxide.

Referring to FIG. 4, the next step is to remove the oxidation 128 areas overlaying much of the polysilicon 114, 116, 118 forming the gate source and drain terminals, as well as over some of the spacer oxide 112. However, portions 140 of the oxide material 128 are left overlapping the top edges of the polysilicon 114, 116, 118. In a preferred embodiment of the present invention, this overlap is approximately one-half micron wide (e.g. for a two micron channel).

Figure 5:
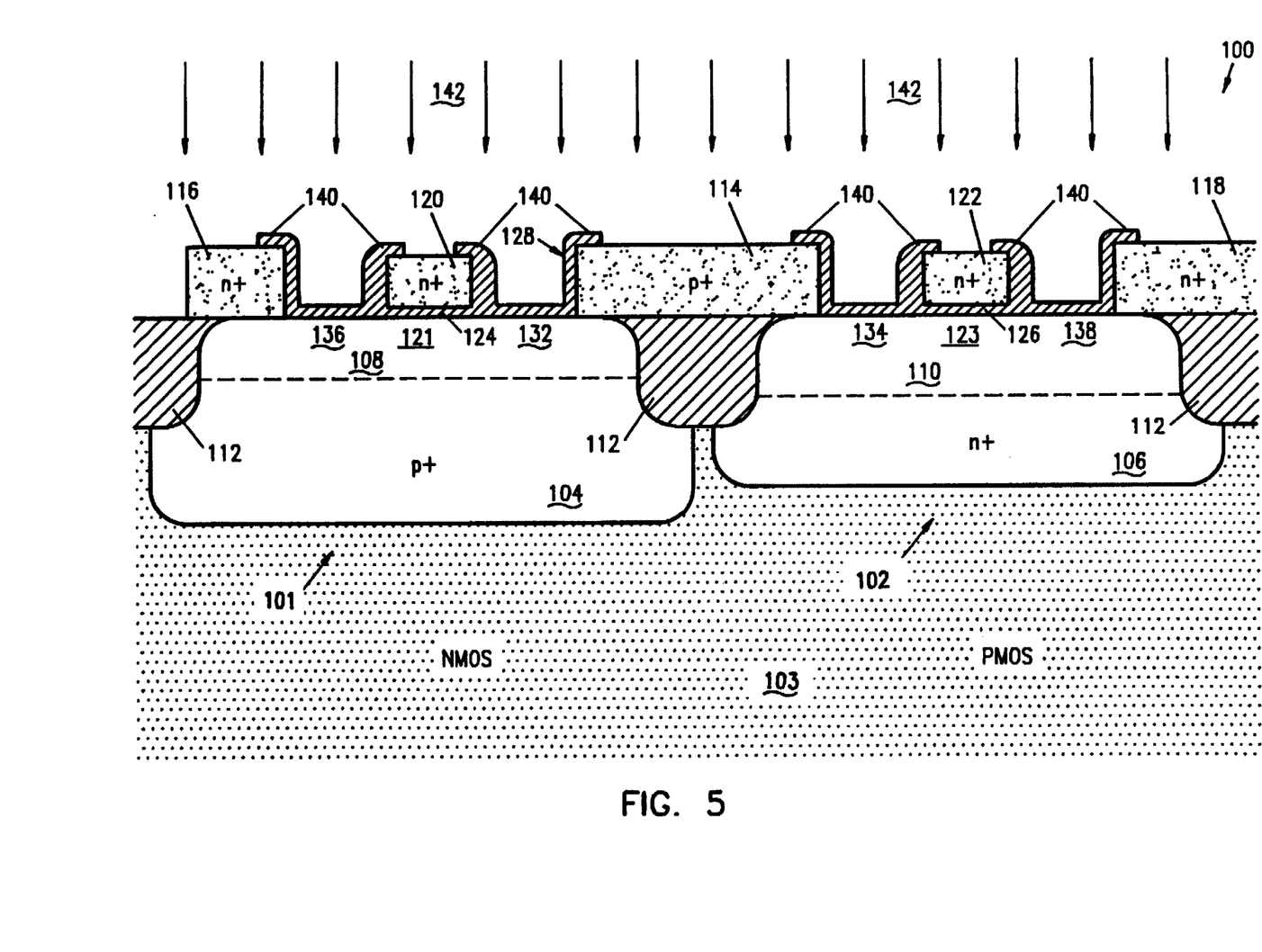
FIG. 5 illustrates the IC of FIG. 4 during the implantation step following the removal of the resist material.

Referring to FIG. 5, the resist material 130 (FIG. 4) is removed and the normal source/drain implantation 142 is performed. However, due to the presence of the remaining oxide 128, no additional source/drain implantation takes place within the drain 132, 134 and source 136, 138 regions of the pldd 108 and nldd 110 areas of these MOSFETs 101, 102. As should be recognized, this advantageously prevents impingement of source/drain implants beneath the gate oxides 124, 126 and edges of the oxide spacers 112. Accordingly, leakage due to band-to-band tunneling is significantly reduced, if not eliminated.

Figure 6:
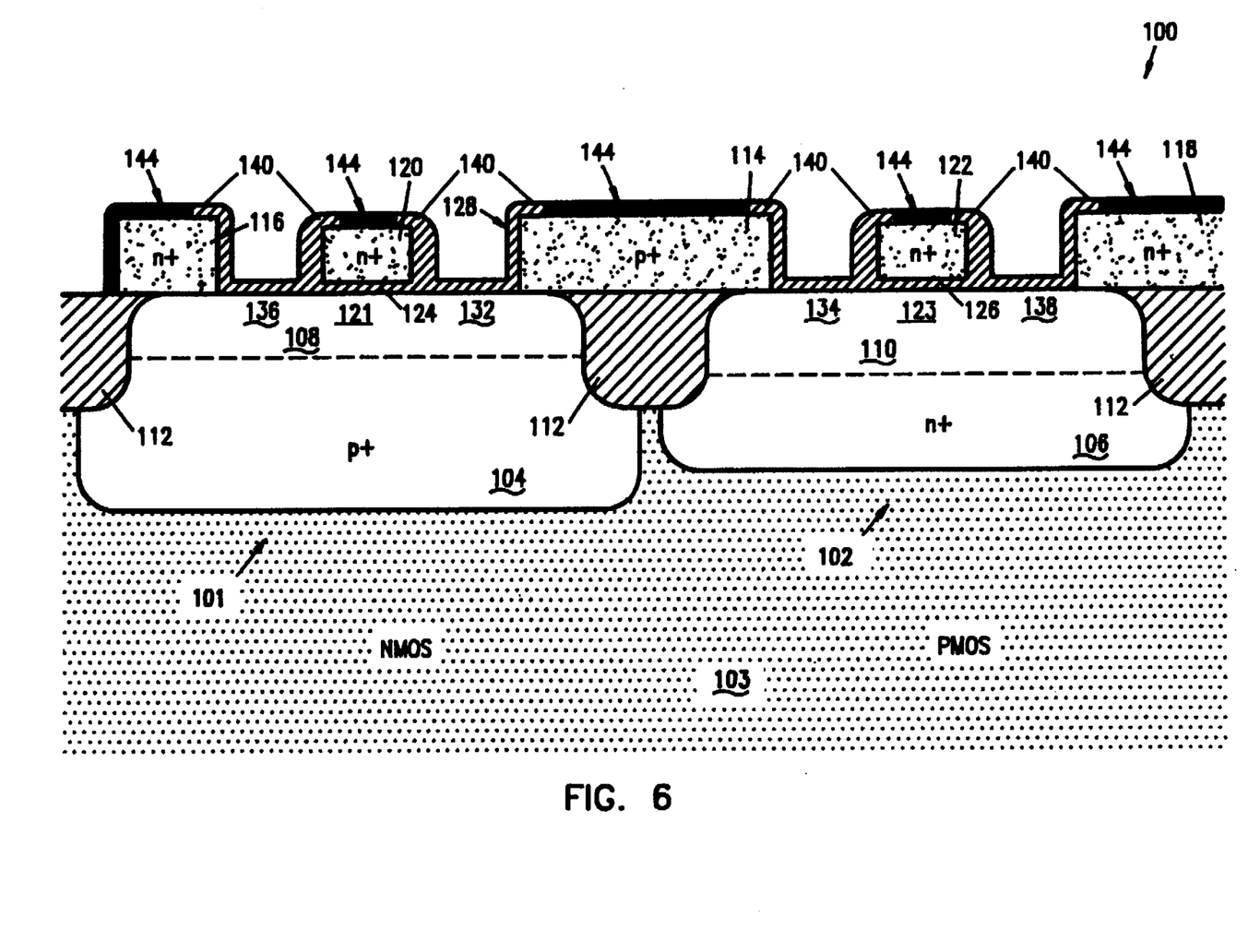
FIG. 6 is a cross sectional view of a portion of a BiCMOS IC with complementary MOSFETs having nested silicide atop the polysilicon gate, source and drain terminals in accordance with one embodiment of the present invention.

Referring to FIG. 6, the next step is to deposit the silicide 144 atop the polysilicon 114, 116, 118, 120, 122 adjacent and between the ends 140 of the remaining oxide 128. It should be understood by one of ordinary skill in the art that while the silicide 144 atop the N+polysilicon 116 forming the source terminal is shown in this example as extending over the edge to the spacer oxide 112, it need not necessarily do so, but could, instead, be limited to the top surface of the N+polysilicon 116 between the edges thereof.

Alternatively, in accordance with the foregoing discussion, MOSFETs in accordance with the present invention can be optimized as desired by removing the oxide 128 from and allowing silicide 144 to form over the source regions which are intended to be grounded within the circuit.

From the foregoing, a number of advantages of a MOSFET in accordance with the present invention should be evident. For example, by retaining regions of silicide 144 nested within the oxide 128, reduced polysilicon resistance is maintained. Further, by preventing formation of silicide on the surfaces of the single crystal silicon, i.e. those areas overlying the drain 132, 134 and source 136, 138 regions, no parasitic Schottky diodes are formed, thereby eliminating leakage components due to such elements. Further still, by retaining the oxide 128 over the drain 132, 134 and source 136, 138 regions and thereby blocking the source/drain implantation, impingement of source/drain implants is prevented from occurring beneath the gate oxides 124, 126 and edges of the spacer oxides 112, thereby significantly reducing, if not eliminating, leakage due to band-to-band tunneling. Moreover, only mask changes are needed for fabricating MOSFETs in accordance with the present invention, i.e. no material changes in the process flow per se are required.

Figure 7A:
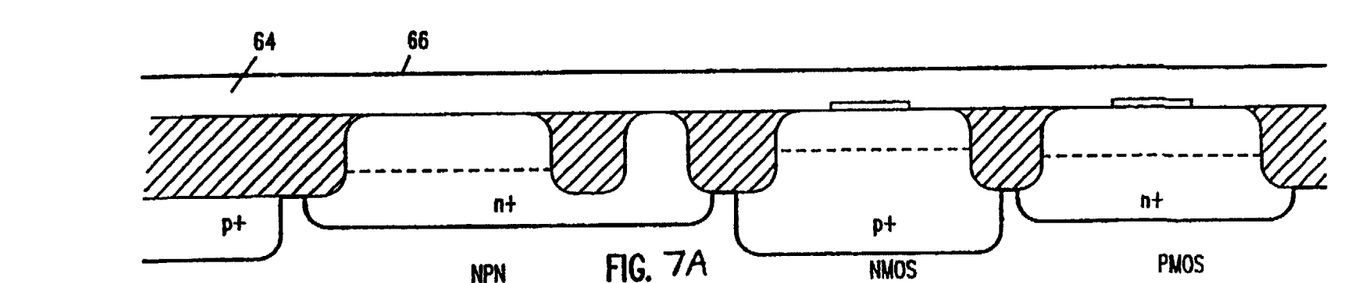
FIGS. 7A through 7G illustrate selected steps in the fabrication of a BiCMOS IC with complementary MOSFETs in accordance with one embodiment of the present invention.
Figure 7B:
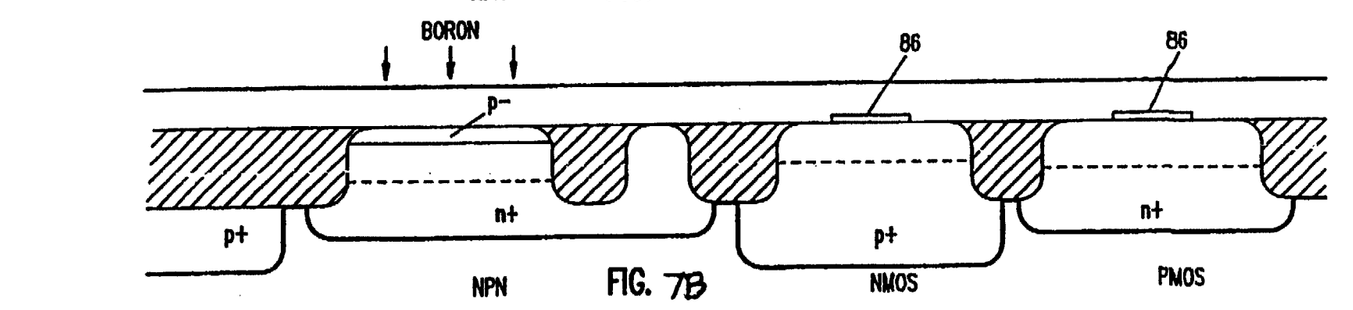

FIG. 7A illustrates the next sequence of process steps. The gate oxide mask is removed ad another layer of intrinsic polysilicon 64 having a thickness of about 1,000 to 4,000 and preferably about 3,200 Å is deposited across the entire surface of the substrate and a cap oxide layer 66 is formed by thermal oxidation of the polysilicon layer 64. The devices are then masked with photoresist to expose at least the base region of the bipolar transistor and the lightly doped regions of the resistors. In some embodiments, only the NMOS and PMOS transistor regions are protected by the mask. A base implant is then performed as shown in FIG. 7B and the base is annealed. In preferred embodiments the base implant uses an energy of between about 30 and 100 keV, with an implant energy of between about 30 and 50 preferred. The dose of this implant is preferably about $3\times10^{13}$ and $8\times10^{15}$. In preferred embodiments the anneal is performed by heating the structure to 900°–950° C. for 30–60 minutes, and results in a p- base region having a thickness of between about 1,000 and 2,000 Å with a dopant concentration of between about $1\times10^{18}$ and $1\times10^{19}/cm^3$, with a dopant concentration of about $5\times10^{18}/cm^3$ preferred.

Figure 7C:
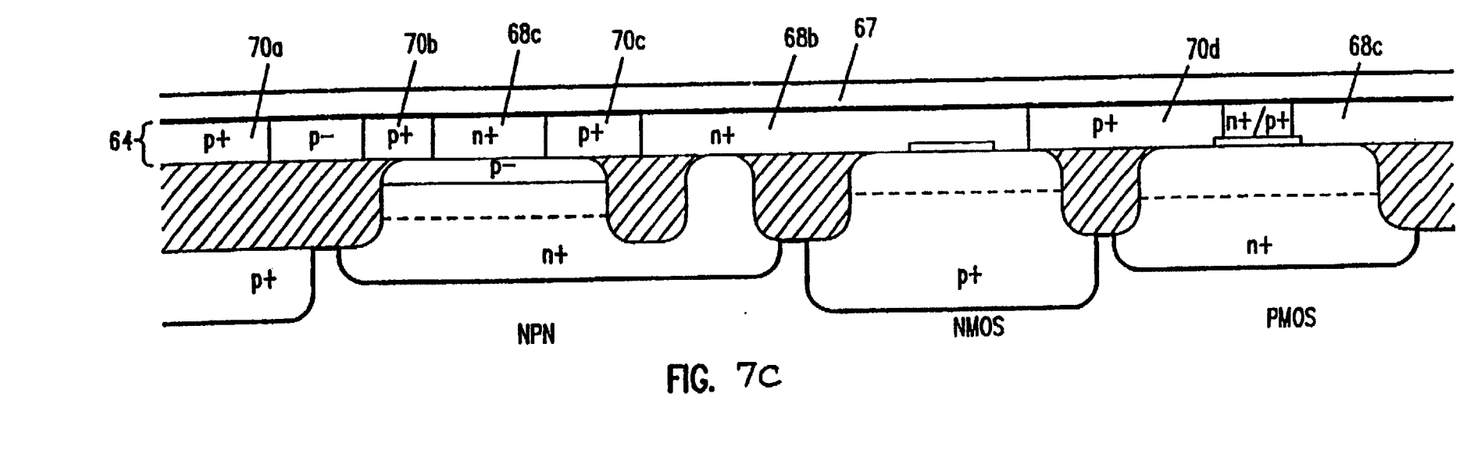

Thereafter, as illustrated in FIG. 7C, a mask is formed which exposes regions 70a, 70b, 70c, and 70d which will eventually be a portion of the resistor, the base contacts, and the contact 32. The regions are preferably doped p+ to a concentration of between about $1\times10^{19}$ and $1\times10^{20}/cm^3$ with a dopant concentration of about $6\times10^{19}/cm^3$ preferred using boron. The p+mask is removed and another mask is formed on the surface of the device to expose regions 68a, 68b, and 68c which will eventually be used as the bipolar emitter, the bipolar collector contact, the source/drain contacts, and the gates of the MOS transistors. The regions 68 are doped n+ using an arsenic implant with an energy of about 100 keV to a concentration of between about $5\times10^{19}$ and $1\times10^{20}/cm^3$. As discussed above, the PMOS gate may be either n+ or p+ mask. A layer of nitride 67 having a thickness of between about 1,000 and 1,200 Å is then deposited for the purpose of preventing etch undercutting of the underlying polysilicon, and preventing the link implant from going into gates and emitters. The polysilicon layer 64 is then annealed at 900° C. for a time of about 15 minutes.

Figure 7D:
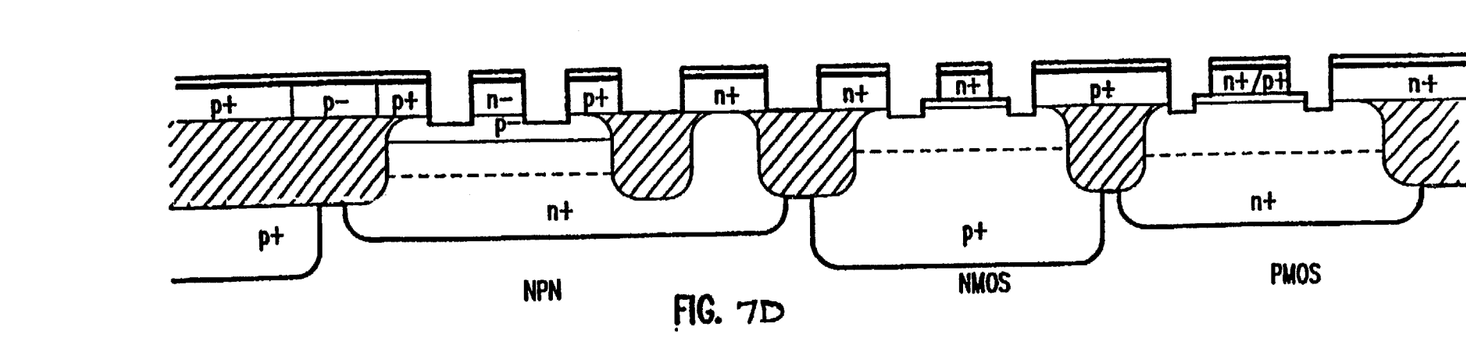

Next, a mask is formed on the surface of the nitride to protect the base, emitter, and collector contacts of the bipolar transistors and the source, gate, and drains of the NMOS and PMOS transistors. A dry etch with chlorine chemistry results in the structure shown in FIG. 7D. As shown, the etch is conducted such that the bipolar base and the epitaxial region adjacent the gates of the MOSFETs are etched below the original epitaxial surface by about 1,000 to 2,000 Å.

Figure 7E:
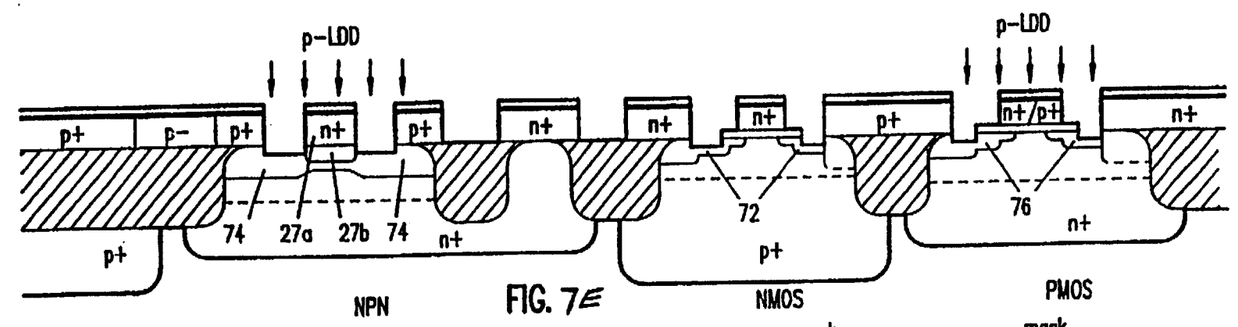

The next sequence of steps is illustrated in FIG. 7E. The etch mask is removed. A lightly doped drain (LDD) implant is performed in which the source and the drain of the NMOS transistor are lightly implanted with an n-type dopant such as phosphorus using an implant energy of between about 20 and 50 keV with implant energies of between about 20 and 40 keV preferred. This implant results in source and drain regions 72 which are self-aligned to the NMOS gate with a dopant concentration of about 5×10¹⁷ and 1×10¹⁹/cm³. After an oxidation step to grow a cap oxide, a p-type LDD using a dopant such as $BF_2$ is performed across the surface of the bipolar transistor and the PMOS transistor with the source and drain of the PMOS transistor and the base region of the bipolar transistor exposed by a mask. A more heavily doped p-region 74 which is self-aligned to the emitter is formed in the base of the bipolar transistor and a more heavily doped p-region 76 which is self-aligned to the gate is formed around the gate of the PMOS transistor. The resulting net dopant concentration in the regions 74 and 76 is between about $5 \times 10^{17}$ and $1 \times 10^{19}/cm^3$. The implant energy is preferably between about 40 and 60 keV. As shown, more heavily doped well ties are also diffused from the NMOS and PMOS contacts. Also, an emitter region 27b is diffused from the overlying emitter contact 27a and heavily doped extrinsic base regions are diffused from the base contact.

Figure 7F:
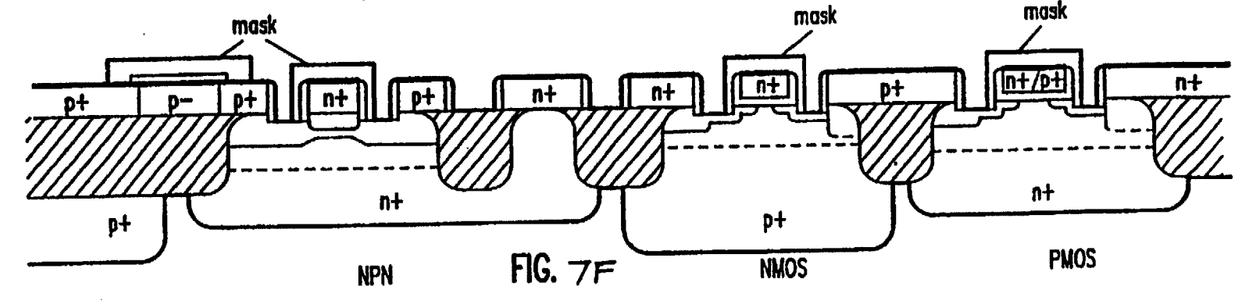
Figure 7G:
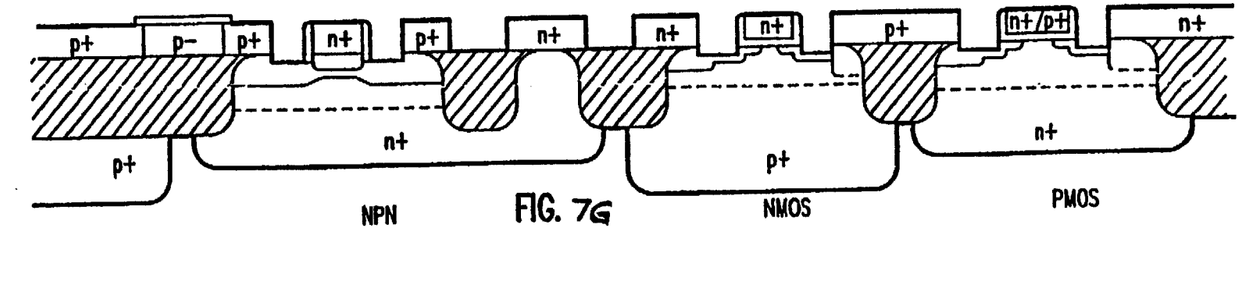

Referring to FIG. 7F, nitride is stripped from the surface of the device and a Low Temperature Oxide (LTO) deposition is performed. A silicide exclusion mask, not shown, is formed on the device on polysilicon regions where silicide formation is not desired (e.g., over the center portion of the resistor). The oxide is then etched back, leaving spacer oxide on exposed sides of the source contacts, drain contacts, gates, emitters, base contacts, and collector contacts using means known to those of skill in the art. The mask shown in FIG. 7F is then formed over the device for protection of at least the sidewall oxide on the bipolar emitter, the gates of the NMOS and PMOS transistors, and the resistor. The device is etched with BOE for about 1 minute, and as shown in FIG. 7G, the oxide is removed from the sidewall of the resistor/base contacts, the collector contacts, and the source and drain contacts of the NMOS and PMOS transistors. In alternative embodiments, sidewall oxide is selectively formed on the sidewall of polysilicon according to the process disclosed in U.S. patent application Ser. No. 07/503,491 which is incorporated herein by reference of all purposes.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An integrated circuit including a metal-oxide-semiconductor field effect transistor (MOSFET) with reduced leakage current, said MOSFET comprising:

a drain region with a top surface;

a drain terminal, with a top surface, disposed on and in direct contact with a first portion of said top drain region surface;

a first silicide layer disposed on said top drain terminal surface;

a first oxide layer disposed on and in direct contact with a second portion of said top drain region surface;

a source region with a top surface;

a source terminal with a top surface disposed on a first portion of said top source region surface;

a channel region between said drain and source regions;

a gate terminal with a top surface disposed opposite said channel region; and a second silicide layer disposed on said top gate terminal surface;

wherein either said top drain terminal surface or said top gate terminal surface is wider than said first silicide layer or said second silicide layer, respectively.

2. An integrated circuit as recited in claim 1, further comprising a second oxide layer disposed on and in direct contact with a second portion of said top source region surface.

3. An integrated circuit as recited in claim 1, further comprising a third silicide layer disposed on said top source terminal surface.

4. An integrated circuit as recited in claim 3, wherein said top source terminal surface is wider than said third silicide layer.

5. An integrated circuit as recited in claim 4, wherein said top source terminal surface has opposing edges and said third silicide layer is disposed between said opposing edges and does not extend to one thereof.

6. An integrated circuit including a metal-oxide-semiconductor field effect transistor (MOSFET) with reduced leakage current, said MOSFET comprising:

a drain region with a top surface;

a drain terminal, with a top surface, disposed on and in direct contact with a first portion of said top drain region surface;

a first silicide layer disposed on said top drain terminal surface;

a first oxide layer disposed on and in direct contact with a second portion of said top drain region surface;

a source region with a top surface;

a source terminal with a top surface disposed on a first portion of said top source region surface;

a channel region between said drain and source regions;

a gate terminal with a top surface disposed opposite said channel region; and a second silicide layer disposed on said top gate terminal surface;

wherein either said top drain terminal surface or said top gate terminal surface is wider than said first silicide layer or said second silicide layer, respectively, and wherein said drain, source and gate terminals together comprise a plurality of noncontiguous portions of a single, identical layer of semiconductor material.

7. An integrated circuit as recited in claim 6, further comprising a second oxide layer disposed on and in direct contact with a second portion of said top source region surface.

8. An integrated circuit as recited in claim 6, further comprising a third silicide layer disposed on said top source terminal surface.

9. An integrated circuit including a metal-oxide-semiconductor field effect transistor (MOSFET) with reduced leakage current, said MOSFET comprising:

a drain region with a top surface;

a drain terminal with a top surface disposed on a first portion of said top drain region surface;

a first silicide layer disposed on said top drain terminal surface;

a first oxide layer disposed on and in direct contact with a second portion of said top drain region surface;

a source region with a top surface;

a source terminal with a top surface disposed on a first portion of said top source region surface;

a channel region between said drain and source regions;

a gate terminal with a top surface disposed opposite said channel region; and a second silicide layer disposed on said top gate terminal surface;

wherein said top drain terminal surface is wider than said first silicide layer and said top gate terminal surface is wider than said second silicide layer.

10. An integrated circuit as recited in claim 1, wherein said top drain terminal surface has opposing edges and said first silicide layer is disposed between said opposing edges and does not extend to one thereof.

11. An integrated circuit including a metal-oxide-semiconductor field effect transistor (MOSFET) with reduced leakage current, said MOSFET comprising:

a drain region with a top surface;

a drain terminal with a top surface disposed on a first portion of said top drain region surface;

a first silicide layer disposed on said top drain terminal surface;

a first oxide layer disposed on and in direct contact with a second portion of said top drain region surface;

a source region with a top surface;

a source terminal with a top surface disposed on a first portion of said top source region surface;

a channel region between said drain and source regions;

a gate terminal with a top surface disposed opposite said channel region; and a second silicide layer disposed on said top gate terminal surface;

wherein either said top drain terminal surface or said top gate terminal surface is wider than said first silicide layer or said second silicide layer, respectively, and wherein said top gate terminal surface has opposing edges and said second silicide layer is disposed between said opposing edges and does not extend to one thereof.

12. An integrated circuit including a metal-oxide-semiconductor field effect transistor (MOSFET) with reduced leakage current, said MOSFET comprising:

a drain region with a top surface;

a drain terminal with a top surface disposed on a first portion of said top drain region surface;

a first silicide layer disposed on said top drain terminal surface;

a first oxide layer disposed on and in direct contact with a second portion of said top drain region surface;

a source region with a top surface;

a source terminal with a top surface disposed on a first portion of said top source region surface;

a channel region between said drain and source regions;

a gate terminal with a top surface disposed opposite said channel region; and a second silicide layer disposed on said top gate terminal surface;

wherein said top drain terminal surface is wider than said first silicide layer and said top gate terminal surface is wider than said second silicide layer, and wherein said drain, source and gate terminals together comprise a plurality of noncontiguous portions of a single, identical layer of semiconductor material.

13. An apparatus including a metal-oxide-semiconductor field effect transistor (MOSFET) with reduced leakage current, said MOSFET comprising:

a semiconductor substrate;

a drain region within said semiconductor substrate with first and second drain region surface areas;

a drain terminal adjacent said first drain region surface area with opposing first and second drain terminal surfaces, wherein said first drain terminal surface is adjacent and substantially parallel to said first drain region surface area;

a first silicide layer adjacent and substantially parallel to said second drain terminal surface, wherein said first silicide layer has a first width and said second drain terminal surface has a second width;

a first oxide layer adjacent and substantially parallel to said second drain region surface area;

a source region within said semiconductor substrate with first and second source region surface areas;

a source terminal adjacent said first source region surface area with opposing first and second source terminal surfaces, wherein said first source terminal surface is adjacent and substantially parallel to said first source region surface area;

a channel region within said semiconductor substrate between said drain and source regions;

a gate terminal with opposing first and second gate terminal surfaces, wherein said first gate terminal surface is disposed near said substrate and opposite said channel region, and wherein said second gate terminal surface has opposing edges and said second silicide layer is between said opposing edges and does not extend to one thereof; and a second silicide layer adjacent and substantially parallel to said second gate terminal surface, wherein said second silicide layer has a third width and said second gate terminal surface has a fourth width;

wherein either said first width or said third width is less than said second width or said fourth width, respectively.

* * * * *

UNITED STATES PATENT AND TRADEMARK OFFICE
CERTIFICATE OF CORRECTION

PATENT NO.: 5,801,424
DATED: September 1, 1998
INVENTOR(S): Thomas Luich

It is certified that one error appears in the above-identified patent and that said Letters Patent is hereby corrected as shown below:

In Col. 7, line 9, delete "1" and replace with --9--.

Signed and Sealed this

Eighth Day of December, 1998

Attest:

BRUCE LEHMAN

Attesting Officer

Commissioner of Patents and Trademarks